United States Patent [19]

Wilkinson

[11] Patent Number: 4,571,546

[45] Date of Patent: Feb. 18, 1986

[54] DIGITAL RANDOM ERROR GENERATOR SUPPLYING BURST ERROR SIGNALS OF RANDOM DURATIONS STARTING AT RANDOM TIMES

[75] Inventor: James H. Wilkinson, Tadley, Near Basingstoke, United Kingdom

[73] Assignee: Sony Corporation, Tokyo, Japan

[21] Appl. No.: 552,117

[22] Filed: Nov. 16, 1983

[30] Foreign Application Priority Data

Nov. 30, 1982 [GB] United Kingdom ............... 8234055

[51] Int. Cl.⁴ .................... G06F 7/00; H03K 3/017
[52] U.S. Cl. ........................... 328/61; 307/260; 328/74; 328/129.1; 331/78; 364/717
[58] Field of Search ............. 307/260; 328/59–61, 328/74, 104, 129.1, 187, 188; 331/78; 364/717; 324/73 R

[56] References Cited

U.S. PATENT DOCUMENTS

| | | | |
|---|---|---|---|
| 3,790,768 | 2/1974 | Chevalier et al. | 331/78 X |
| 3,875,528 | 4/1975 | Hirsch | 331/78 |
| 3,946,215 | 3/1976 | May | 364/717 |
| 4,188,583 | 2/1980 | McCurdy | 331/78 X |
| 4,202,051 | 5/1980 | Davida et al. | 331/78 X |
| 4,213,101 | 7/1980 | Policand et al. | 328/59 X |
| 4,450,321 | 5/1984 | Quigley et al. | 364/717 X |

OTHER PUBLICATIONS

Buron et al, "Noise Generated by Digital Technique", IBM Tech. Disc. Bull., vol. 8, No. 9, Feb. 1966, p. 1232.

Primary Examiner—Stanley D. Miller
Assistant Examiner—D. R. Hudspeth
Attorney, Agent, or Firm—Lewis H. Eslinger; Alvin Sinderbrand

[57] ABSTRACT

A digital random error generator for generating burst errors comprises a first digital random error generator arrangement including a first pseudo random generator and a static random number generator for generating burst start signals at random times, a second digital random error generator arrangement including a second pseudo random generator and a second static random number generator for generating burst errors of random duration, and a flip-flop circuit receiving the outputs of the digital random error generator arrangements whereby the output of the second digital random error generator arrangement is enabled in dependence on the output of the first digital random error generator arrangement, so that the digital random error generator supplies a burst error of random duration starting at each above-mentioned random time.

12 Claims, 11 Drawing Figures

DIGITAL RANDOM ERROR GENERATOR SUPPLYING BURST ERROR SIGNALS OF RANDOM DURATIONS STARTING AT RANDOM TIMES

BACKGROUND OF THE INVENTION

1. Field of the Invention

This invention relates to digital random error generators.

2. Description of the Prior Art

A digital random error generator is a useful tool when evaluating and testing digital transmission systems. Moreover, in the design stage of such a system a controllable random error generator can indicate the limitations of the system, while in production testing, equipment faults can be located more quickly if a controllable random error generator is available.

A particular requirement arises where the transmission system comprises a digital video tape recorder supplying a signal to a digital video signal processor having an error detection and correction capability. In testing such a system a digital random error generator able to generate both random and burst errors of the kind which arise in practice when reproducing from a video magnetic tape can be used to simulate normal operational conditions for basic testing of the system, and also for generation of specific abnormal conditions when searching for design weaknesses.

SUMMARY OF THE INVENTION

One object of the present invention is to provide a digital random error generator capable of generating both random and burst errors of the kind which arise in practice when reproducing from a video magnetic tape.

Another object of the present invention is to provide a digital random error generator capable of generating burst errors of random duration starting at random times.

Another object of the present invention is to provide a digital random error generator capable of generating error signals for testing digital video signal processors.

According to the present invention there is provided a digital random error generator for generating burst errors and comprising: a first digital random error generator means for generating burst start signals at random times; a second digital random error generator means for generating burst errors of random duration; and means to enable the output of said second digital random error generator means in dependence of the output of said first digital random error generator means, so that said digital random error generator supplies a burst error of random duration starting at each said random time.

According to the present invention there is also provided a digital random error generator comprising:

a pseudo random generator for supplying a varying n-bit output;

n 2-input exclusive-OR gates to respective first inputs of which the bits of said n-bit output are supplied;

means to supply the bits of a static n-bit number to respective second inputs of said exclusive-OR gates;

n further gates to which the outputs of respective said exclusive-OR gates are supplied;

means selectively to enable a plurality of said further gates; and an n-input output gate to respective inputs of which the outputs of said further gates are supplied;

said output gate supplying random outputs in dependence on said pseudo random generator, said static n-bit number and the enabling of said further gates.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
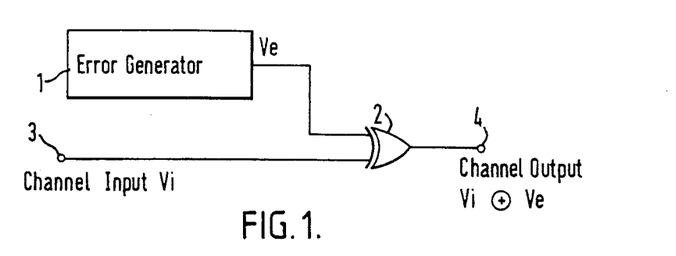
FIG. 1 shows in block form a circuit arrangement for adding error signals to a signal channel.

FIG. 1 shows how errors can be introduced into a binary channel. An error generator 1 is connected to one input of an exclusive-OR gate 2, having a second input which is connected to a channel input terminal 3. The output of the exclusive-OR gate 2 is connected to an output terminal 4. Binary data Vi in serial form is supplied by way of the terminal 3 to the exclusive-OR gate 2, and so long as the error signal Ve supplied by the error generator 1 to the exclusive-OR gate 2 remains all "0s" the data Vi will be supplied uncorrupted to the output 4. Thus the channel output is given by:

$$Vi \oplus Ve = Vi$$

Whenever the error Ve becomes "1", the data Vi is corrupted, because one bit therein is inverted by the exclusive-OR gate 2 to produce an error. In this case the channel output is given by:

$$Vi \oplus Ve = \overline{Vi}$$

The error rate on the output is defined as the ratio of Ve to Vi taken over a very long time interval. That is:

$$\text{error rate} = \frac{\text{number of error bits in (long) unit time}}{\text{number of data bits in (long) unit time}}$$

The problem then is to devise a method of generating and controlling the error signal Ve.

Figure 2:
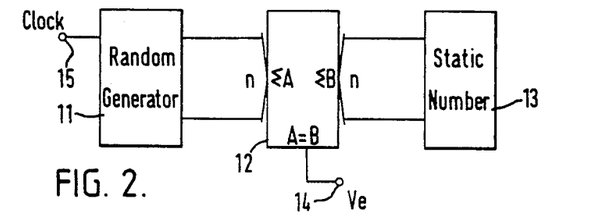
FIG. 2 shows in block form an example of a basic digital random error generator.

FIG. 2 shows a basic digital random error generator comprising a random generator 11 supplying an n-bit output to one set of inputs of a comparator 12, while a static (unchanging) number also of n-bits is supplied from a static number source 13 to another set of inputs of the comparator 12. When the two input n-bit numbers supplied to the comparator 12 are identical, the comparator 12 supplies an output "1" to an output terminal 14, this output forming the error signal Ve.

The random generator 11 is an n-stage shift register having feedback connections between stages so arranged that the shift register produces outputs of a maximum length sequence, that is, all code combinations, except all "0s", in a random order under control of a clock pulse signal having a clock pulse rate of Rc, supplied to a clock terminal 15.

Assuming that the shift register generates all code combinations, except all "0s", then the error signal Ve will occur at an error rate Re given by:

$$Re = \frac{Rc}{(2^n - 1)}$$

If the value of the static number is changed this will change the relative position of the error signal Ve, and varying the value of n changes the error rate Re, but it is to be noted that the error rate Re is, in effect, predetermined rather than random, because it is dependent on n. Moreover, this digital random error generator as shown in FIG. 2 is unsatisfactory because the error signal Ve has a constant period given by:

$$\frac{2^n - 1}{Rc}$$

Variation of this period while retaining the mean value of the error rate Re constant can be achieved in either of two ways.

Firstly, the static number could be varied by replacing the static number source 13 by a second random generator. Care would need to be taken to ensure that the two random generators did not track, that is to say, did not have a non-random correlation in their operation. This is, in fact, difficult to achieve because such so-called random generators are in fact only pseudo random generators because there is always a predetermined relation between the output subsequent to a given clock pulse and the output prior to that clock pulse. However, with such an arrangement the repeat period of the error signal Ve would be:

$$\frac{(2^n - 1)^2}{Rc}$$

and the positional variation of the error signal Ve occurrences within this period would be random. The two particular problems with this are that it is very difficult to show that two random generators are statistically independent and, more important, the repeat period is dependent on n, and if n is less than about say ten, the random qualities of the error signal Ve become suspect.

Secondly, the number of stages in the shift register can be increased, and this solution has the advantage of simpler design. The shift register still supplies an n-bit output to the comparator 12, but the number of stages in the shift register is increased to $n+m$ where m is greater than one and is, of course, quite independent of n. This means that the sequence length of the shift register output will become $2^{(n+m)} - 1$. This means that the number of occurrences of the error signal Ve within the repeat period of:

$$\frac{2^{(n+m)} - 1}{Rc}$$

is approximately $2^m$. Generally speaking, a value of m greater than or equal to ten is found to be satisfactory, although as a general rule larger values of m produce more reliable results.

An embodiment of digital random error generator according to the invention and which makes use of this approach will now be described with reference to FIG. 3.

A feedback shift register forming a pseudo random generator 21 for generating a maximum length sequence (except all "0s") is shown as having eight outputs Q1 to Q8 corresponding to eight stages of the shift register, although in practice a substantially larger number of stages and outputs would normally be used. Each of the outputs Q1 to Q8 of the shift register is connected to one input of a respective exclusive-OR gate 22, to respective second inputs of which are respectively supplied the bits SR1 to SR8 of a static random number supplied by a static random number generator 23. The output of each of the exclusive-OR gates 22 is connected to one input of a respective NAND-gate 24, each of which has a respective second input to which bit control signals EN1 to EN8 are supplied by a bit control circuit 25. The outputs of the eight NAND-gates 24 are connected to respective inputs of a NAND-gate 26, the output of which is connected to an output terminal 27 at which the error signal Ve is derived. The shift register is driven by a clock pulse signal supplied to a clock terminal 28.

Figure 3:
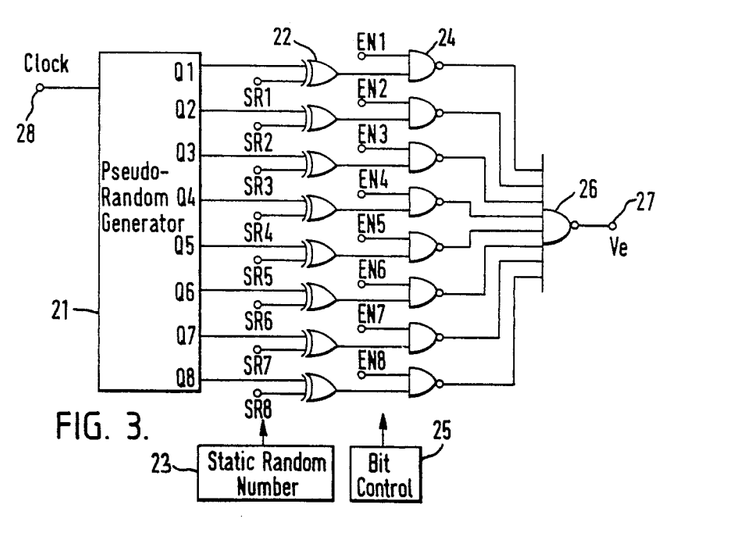
FIG. 3 shows in block form an embodiment of digital random error generator according to the invention.

In operation of the digital random error generator of FIG. 3, the shift register is driven at the clock pulse rate and in consequence there is substantial correlation between each current state of the shift register and its previous state. However, the use of a random static number, the bits of which are supplied to respective second inputs of the exclusive-OR gates 22 reduces this correlation, and moreover by randomly activating the bit control circuit 25 which supplies the bit control signals EN1 to EN8 to the second inputs of the NAND-gates 24, so that a random selection of from one upwards of the NAND-gates 24 are enabled at any given time, the correlation is further substantially reduced. The error rate is determined by the number of the NAND-gates 24 enabled.

Thus, if for example at a given time, two of the NAND-gates 24 are enabled, then the logic circuit will in effect be searching for the 2-digit pattern corresponding to the two digits of the static random numbers supplied to the second inputs of the two exclusive-OR gates 22 connected to those two NAND-gates 24, so the error rate will be 1 in $2^2$. The number of the NAND-gates 24 enabled may then be changed, for example to three, it being preferred in such a case that three different NAND-gates 24, that is to say not including the two previously-mentioned NAND-gates 24 are then enabled.

Figure 4:
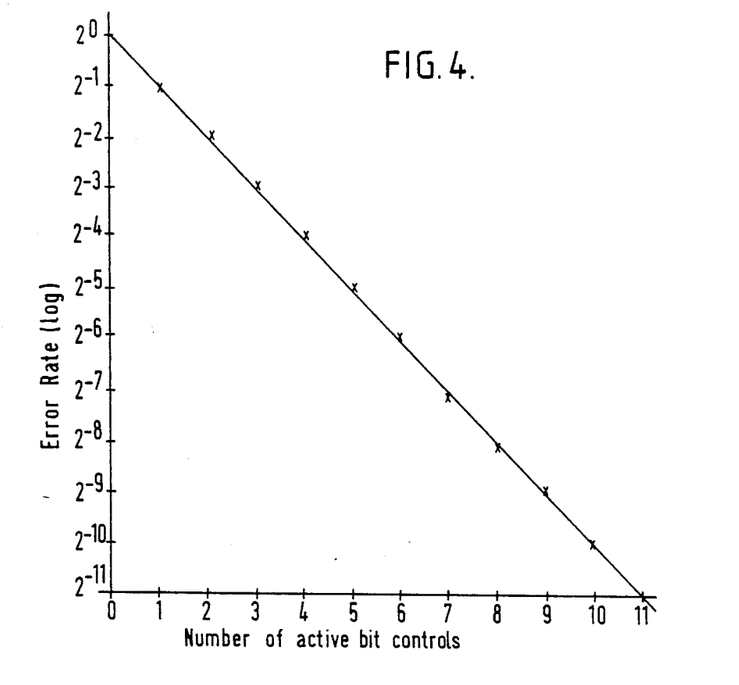
FIG. 4 is a graph showing the operation of the embodiment of FIG. 3.

Experiments with such an embodiment have shown that the error signal Ve produced is random so far as the experimental method used was able to determine. FIG. 4 shows a graph of the error rate plotted against the number of the bit controls used, that is to say against the number of NAND-gates 24 enabled.

Figure 5A:
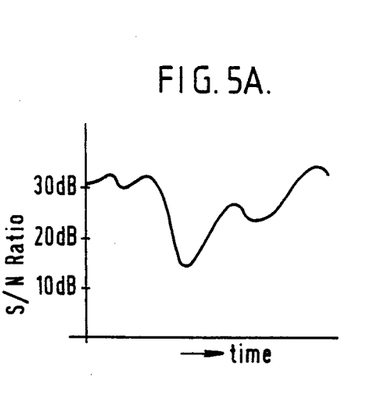
FIGS. 5A, 5B and 6 are graphs illustrating the basic mechanism of generating burst errors.
Figure 5B:
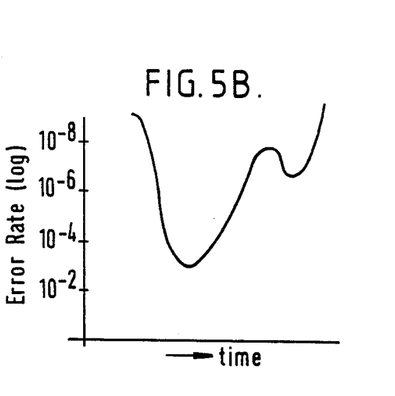

The generation of burst errors is modelled using a channel fade as the basic mechanism. FIG. 5A shows a typical fade characteristic for a channel, plotted as signal-to-noise (S/N) ratio against time. FIG. 5B shows the error rate, plotted as the log of the error rate against time.

Figure 6:
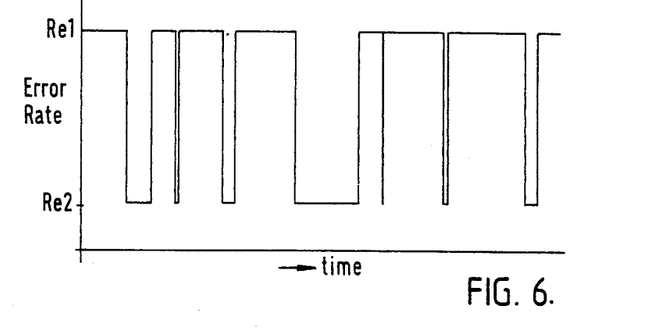
Figure 7:
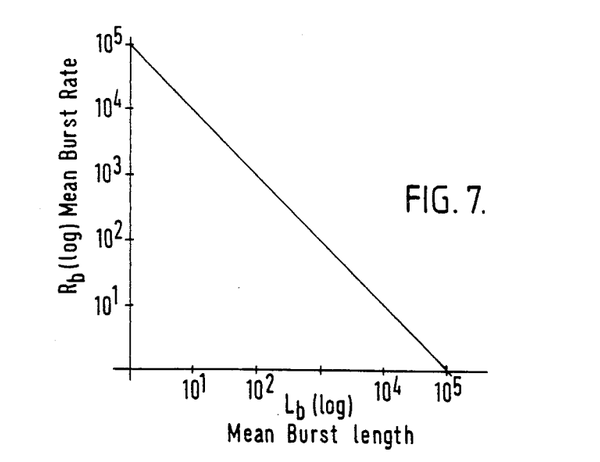
FIG. 7 is a graph showing the relationship between mean burst rates and mean burst length.

In order to synthesize such a characteristic it is necessary to simplify it, and this is done by quantizing the error rate to give a characteristic as shown, for example, in FIG. 6, in which the error rate is plotted against time. In effect the error rate is simply switched between two values Re1 and Re2. The error rate Re2 is the higher error rate and may, for example, be one in two, while the error rate Re1 is the lower error rate and may, for example, be one in $10^5$. The two error rtes Re1 and Re2 are preferably adjustable, and the lower rate Re1 corresponds to an "out of drop-out" or normal background error rate and the higher error rate Re2 corresponds to a "in drop-out" or burst error rate. A burst control gate is arranged to switch between the two error rates Re1 and Re2. In order to synthesize random errors having the general characteristics of those encountered in practice, the characteristics of this control are of importance. The two parameters of the control are the mean burst rate Rb and the mean burst length Lb. In practice the characteristic relationship between the mean burst rate Rb and the mean burst length Lb is as shown in FIG. 7, in which the log of the mean burst rate Rb is plotted against the log of the mean burst length Lb. That is, the mean burst length Lb is inversely proportional to the mean burst rate Rb. This can be expressed as:

$$Lb \cdot Rb = \text{a constant}$$

Other characteristic relationships can be used if required, or to suit particular circumstances. For example:

$$Lb^2 \cdot Rb = \text{a constant}$$

which will give a steeper slope to the line in FIG. 7.

An embodiment of digital random burst error generator according to the invention and which makes use of this approach will now be described with reference to FIG. 8.

Each of first to third pseudo random generators 31, 32 and 33 is formed by a respective feedback shift register for generating a maximum length sequence (except all "0s"). $n_1$ outputs of the first random generator 31 are respectively connected to a first set of $n_1$ inputs of a comparator 34 having a second set of $n_1$ inputs which are respectively connected to $n_1$ output of a first static random number generator 35. A bit control circuit 36 applies up to $n_1$ enable bits to respective enable inputs of the comparator 34. The elements 31, 34, 35 and 36 together form a first random error generator 51 of the same general form and operation as described above with reference to FIG. 3, and control of the bit control circuit 36 enables the frequency of occurrence of the burst errors, that is, the burst start rate, to be generated to be controlled.

The output of the comparator 34 is connected to the S-input of an S-R flip-flop circuit 37 and also to the clock input of a latch circuit 38. The latch circuit 38 has $n_2$ inputs respectively connected to $n_2$ outputs of the second random generator 32, and $n_2$ outputs respectively connected to inputs of a code converter 39 which is formed by a programmable read-only memory (PROM). The code converter 39 supplies $n_3$ outputs to a comparator 40 and with respect to the comparator 40 functions generally as the bit control circuit 36 does in relation to the comparator 34. The comparator 40 also has a first set of $n_3$ inputs which are respectively connected to $n_3$ outputs of the third random generator 33 and a second set of $n_3$ inputs which are respectively connected to $n_3$ outputs of a third static random number generator 41. The output of the comparator 40 is connected to the R-input of the flip-flop circuit 37, the output of which is connected to a burst gate which may correspond to the exclusive-OR gate 2 in the arrangement of FIG. 1. Again the elements 33, 39, 40 and 41 form a second random error generator 52 of the same general form and operation as described with reference to FIG. 3.

In operation, the first random error generator 51 controls the burst start rate, or in other words defines the start position of each error burst. The output of the comparator 34 forms a burst start pulse which is used firstly to set the output of the flip-flop circuit 37, and secondly to initiate the operation of a burst length generator comprising the second random error generator 52. This latter operation is such that the first start pulse in effect samples the output of the second random number generator 32, thus presenting a random number to the PROM which forms the code converter 39. The function of the PROM is to convert the $n_2$ inputs into $$2^{n_2} \text{ (that is, } n_3\text{)}$$

outputs, these outputs being used as the bit controls of the second random error generator 51. The probability of each level of $n_2$ will be equal, hence the number of bit controls enabled will be selected on a random basis.

As an alternative mode of operation, the code converter 39 can be programmed to operate so that the bit controls are not enabled at an equal rate. This will have the effect of changing the slope of the line in FIG. 7. During tests, one characteristic which has been achieved by this method is:

$$Rb \text{ is proportional to } \frac{1}{Lb^2}$$

and it is possible to obtain other characteristics depending upon the requirements.

Figure 9:
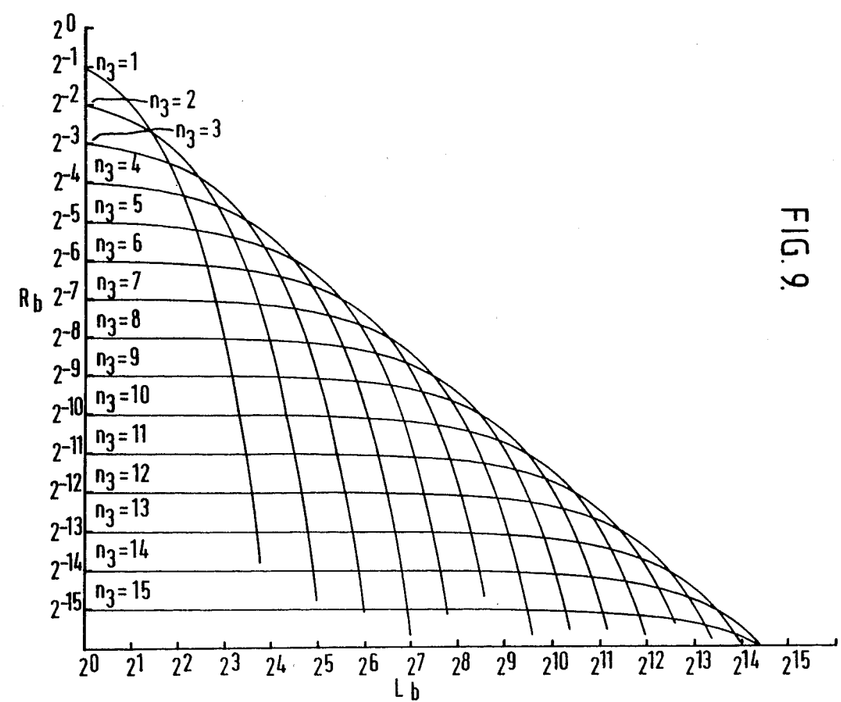
FIGS. 9 and 10 are graphs illustrating the operation of the embodiment of FIG. 8.

In summary, therefore, the random error generator 51 controls the frequency of occurrence of the bursts, and the random error generator 52 controls the length of the individual bursts. FIG. 9 shows the effect of each value of $n_2$ on the probability of a particular burst length. Each line in FIG. 9 is a binomial distribution of the form:

$$Rb = p\{(1-p)^{(Lb-1)}\}$$

where p is $2^{-n_3}$ and Rb is thhe probability of a burst length Lb. Since in the chosen characteristic each level of $n_2$ is equally probable, then the overall distribution of the burst length Lb will be the sum of all levels. This approximates to the characteristic:

$$Rb \text{ is proportional to } \frac{1}{Lb}$$

as shown in FIG. 7, although with a slight deviation where the burst length Lb is less than or equal to two.

Figure 8:
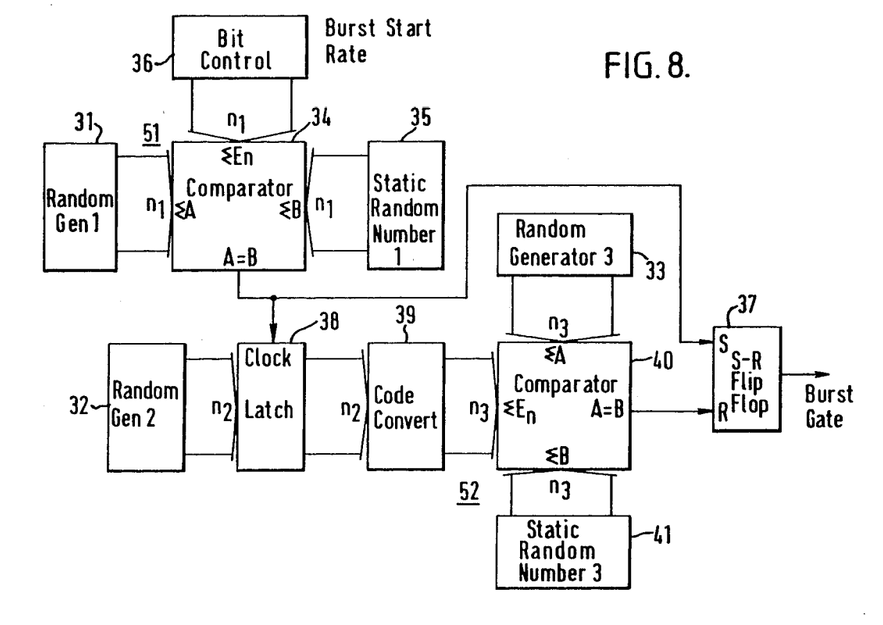
FIG. 8 shows in block form a second embodiment of digital random error generator according to the invention and for generating burst errors.
Figure 10:
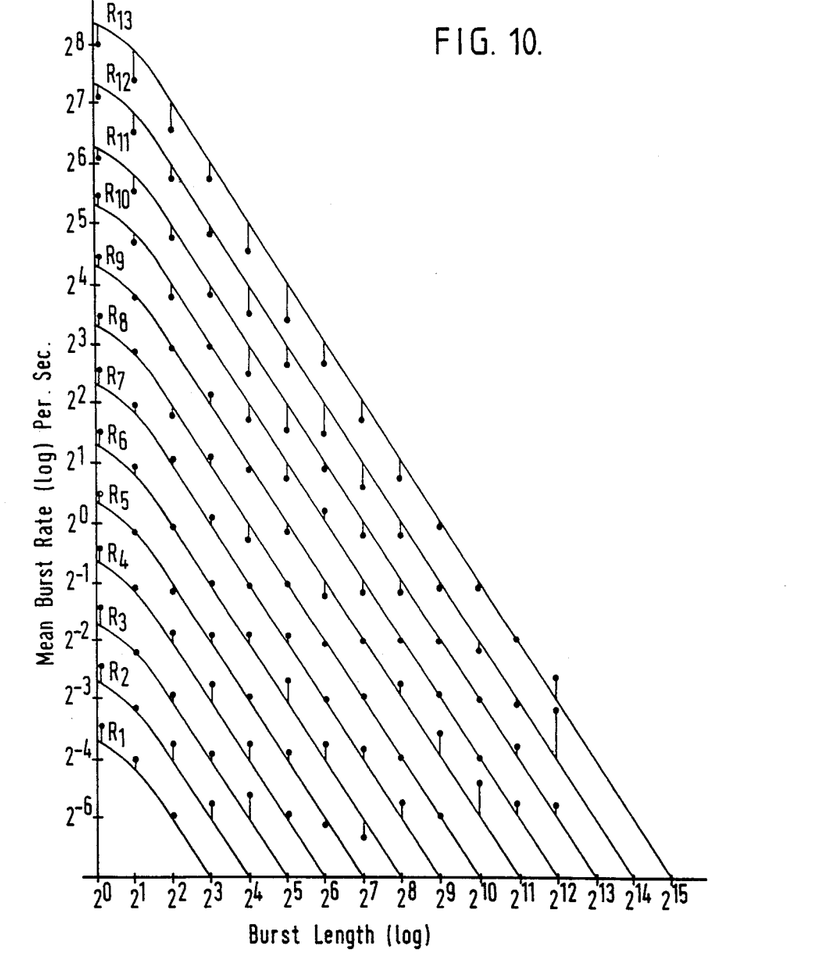

FIG. 10 shows measured results for a particular example of the embodiment of FIG. 8 and in which the log of the mean burst rate Rb is plotted against the log of the burst length Lb for different values of R.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A digital random error generator for generating burst error signals and comprising:

a first digital random error generator means for generating burst start signals at random times;

a second digital random error generator means for generating burst error signals of random duration;

each of said first and second digital random error generator means including a pseudo random generator for supplying a varying value n-bit output, n exclusive-OR gates having first inputs to which respective bits of said varying value n-bit output are supplied, means producing the bits of a static value n-bit number fed to respective second inputs of said exclusive-OR gates, n logic gates to which the outputs of respective ones of said exclusive-OR gates are supplied, means for selectively enabling at least one of said logic gates, and an n-input output gate having the outputs of said logic gates supplied to the respective inputs of said output gate, whereby said output gate supplies random outputs in dependence on said pseudo random generator, said static value n-bit number and said means selectively enabling said logic gates; and means to enable the output of said second digital random error generator means in dependence on the output of said first digital random error generator means, so that said digital random error generator supplies a burst error signal of random duration starting at each said random time.

2. A digital random error generator according to claim 1, wherein said means selectively enabling at least one of said n logic gates of said second digital random error generator means includes a programmable read-only memory; and a third pseudo random generator, wherein said programmable read-only memory receives an input from said third pseudo random generator under the control of said output of said first digital random error generator means.

3. A digital random error generator according to claim 1 wherein each of said pseudo random generators is a feedback shift register.

4. A digital random error generator according to claim 1 wherein each of said logic gates and said output gates in a NAND-gate.

5. A digital random error generator according to claim 1; wherein each of said n exclusive-OR gates is a 2-input exclusive-OR gate.

6. A digital random generator according to claim 1; wherein said means for producing the bits of a static value n-bit number includes static random number generator means.

7. A digital random error generator comprising:

a pseudo random generator for supplying a varying value n-bit output;

n exclusive-OR gates wherein the bits of said varying value n-bit output are supplied to the respective first inputs of said exclusive-OR gates;

means producing the bits of a static value n-bit number fed to respective second inputs of said exclusive-OR gates;

n logic gates to which the outputs of respective ones of said exclusive-OR gates are supplied;

means for selectively enabling at least one of said logic gates; and an n-input output gate wherein the outputs of said logic gates are supplied to the respective inputs of said output gate; whereby said output gate supplies random outputs in dependence on said pseudo random generator, said static value n-bit number and said means selectively enabling said logic gates.

8. A digital random error generator according to claim 7 wherein said pseudo random generator is a feedback shift register.

9. A digital random error generator according to claim 7, wherein each of said logic gates and said output gate is a NAND gate.

10. A digital random error generator according to claim 8; wherein each of said n exclusive-OR gates comprises a 2-input exclusive-OR gate.

11. A digital random error generator according to claim 8; wherein said means for supplying the bits of a static n-bit number includes static random number generator means.

12. A digital random error generator for generating burst error signals and comprising a first digital random error generator means for generating burst start signals at random times;

a second digital random error generator means for generating burst error signals of random duration; and means for enabling the output of said second digital random error generator means in dependence on the output of said first digital random error generator means, so that said digital random error generator supplies a burst error signal of random duration starting at each said random time, said enabling means including a latch having a clock input, plural bit inputs and plural bit outputs, a pseudo random generator for supplying a varying value plural bit output, and an S-R flip-flop having an S-input and an R-input;

and wherein said output of said first digital random error generator means is supplied to said clock input of said latch and to said S-input of said S-R flip-flop, said output of the pseudo random generator is supplied to said inputs of the latch, said outputs of the latch are connected to inputs of said second digital random error generator means, and the output of said second digital random error generator means is supplied to said R-input of the S-R flip-flop.

* * * * *